US008106466B2

(12) United States Patent
Cheng et al.

(10) Patent No.: US 8,106,466 B2
(45) Date of Patent: Jan. 31, 2012

(54) MOS TRANSISTOR AND METHOD FOR FABRICATING THE SAME

(75) Inventors: Po-Lun Cheng, Kao-Hsiung Hsien (TW); Pin-Chien Chu, Kaohsiung County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 382 days.

(21) Appl. No.: 12/189,195

(22) Filed: Aug. 10, 2008

(65) Prior Publication Data
US 2010/0032715 A1 Feb. 11, 2010

(51) Int. Cl.
*H01L 21/02* (2006.01)
*H01L 29/02* (2006.01)

(52) U.S. Cl. ........... 257/408; 257/63; 257/65; 257/288; 257/549; 257/550; 257/E29.266; 257/E29.269; 257/E29.278

(58) Field of Classification Search ............ 257/63, 257/65, 288, E29.104, E31.035, E33.009, 257/408, 549, 550, E29.266, E29.269, E29.278
See application file for complete search history.

(56) References Cited

U.S. PATENT DOCUMENTS
2008/0099846 A1* 5/2008 Ohta .......................... 257/351
2008/0142839 A1* 6/2008 Fukutome et al. .......... 257/190
* cited by examiner

*Primary Examiner* — Long Tran
(74) *Attorney, Agent, or Firm* — Winston Hsu; Scott Margo

(57) ABSTRACT

A method for fabricating a MOS transistor is disclosed. First, a semiconductor substrate having a gate thereon is provided. A spacer is then formed on the sidewall of the gate, and two recesses are formed adjacent to the spacer and within the semiconductor substrate. Next, the spacer is thinned, and epitaxial layer is grown in each of the two recesses. By thinning the spacer before the epitaxial layer is formed, the present invention could stop the epitaxial layer to grow against the sidewall of the spacer, thereby preventing problem such as Ion degradation.

9 Claims, 6 Drawing Sheets

MOS TRANSISTOR AND METHOD FOR FABRICATING THE SAME

BACKGROUND OF THE INVENTION

1. Field of the Invention

The invention relates to a method for fabricating MOS transistors, and more particularly, to a method of using epitaxial selective growth process for fabricating MOS transistors.

2. Description of the Prior Art

A conventional MOS transistor generally includes a semiconductor substrate, such as silicon, a source region, a drain region, a channel positioned between the source region and the drain region, and a gate located above the channel. The gate is composed of a gate dielectric layer, a gate conductive layer positioned on the gate dielectric layer, and a plurality of spacers positioned on the sidewalls of the gate conductive layer. Generally, for a given electric field across the channel of a MOS transistor, the amount of current that flows through the channel is directly proportional to a mobility of the carriers in the channel. Therefore, how to improve the carrier mobility so as to increase the speed performance of MOS transistors has become a major topic for study in the semiconductor field.

The formation of SiGe source/drain regions is commonly achieved by epitaxially growing a SiGe layer adjacent to the spacers within the semiconductor substrate after forming the spacer. In this type of MOS transistor, a biaxial tensile strain occurs in the epitaxial silicon layer due to the silicon germanium, which has a larger lattice constant than silicon, and, as a result, the band structure alters, and the carrier mobility increases. This enhances the speed performance of the MOS transistor.

However, it should be noted in the conventional art for conducting selective epitaxial growth process to form epitaxial layer, the epitaxial layer is typically grown against the sidewall of the spacer. This type of growing behavior often causes reduced strain in the channel region of the transistor and induces a Ion degradation phenomenon. As a result, the performance of the device is greatly affected.

SUMMARY OF THE INVENTION

It is an objective of the present invention to provide a method for fabricating a MOS transistor for solving the aforementioned problem.

A method for fabricating a MOS transistor is disclosed. First, a semiconductor substrate having a gate thereon is provided. A spacer is then formed on the sidewall of the gate, and two recesses are formed adjacent to the spacer and within the semiconductor substrate. Next, the spacer is thinned, and epitaxial layer is grown in each of the two recesses.

According to another aspect of the present invention, a MOS transistor is disclosed. The MOS transistor preferably includes: a semiconductor substrate having a gate thereon; a spacer disposed on the sidewall of the gate; and two hexagonal epitaxial layer disposed in the semiconductor substrate with respect to two sides of the spacer.

By using a wet etching to thin a portion of the offset spacer before pre-cleaning the recesses, the present invention could prevent the epitaxial layer to grow against the sidewall of the offset spacer. Instead, a gap of approximately 50 angstroms to 150 angstroms is formed between the epitaxial layer and the sidewall of the offset spacer. According to a preferred embodiment of the present invention, the epitaxial layer is grown with a substantial hexagonal shape in the semiconductor substrate at two sides of the offset spacer. By forming the gap between the epitaxial layer and the offset spacer, Ion degradation resulted from epitaxial layer being too close to the offset spacer is improved significantly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
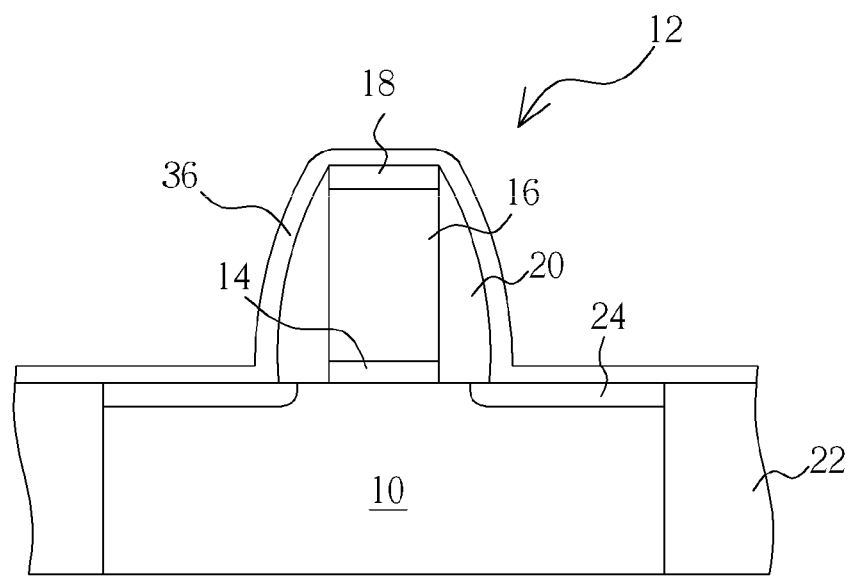
FIGS. 1-5 illustrate a method for fabricating a PMOS transistor according to a first embodiment of the present invention.

Referring to FIGS. 1-5, FIGS. 1-5 illustrate a method for fabricating a PMOS transistor according to a first embodiment of the present invention. As shown in FIG. 1, a semiconductor substrate 10, such as a silicon wafer or a silicon-on-insulator substrate is provided. A gate structure 12 is disposed on the semiconductor substrate 10, and the active region for which the gate structure 12 resides in is surrounded by a shallow trench isolation 22. The gate structure 12 includes a gate dielectric layer 14, a gate 16 disposed on the gate dielectric layer 14, and a cap layer 18 disposed on top of the gate 16. The gate dielectric layer 14 is composed of silicon oxides or silicon nitrides, the gate 16 is composed of conductive materials such as polysilicon, silicides, or other metals, and the cap layer 18 is composed of dielectric material such as silicon nitride.

Next, an offset spacer 20 composed of silicon nitride is formed on the sidewall of the gate structure 12, and an ion implantation is conducted by using the gate structure 12 and the offset spacer 20 as a mask to implant p-type dopants into the semiconductor substrate 10 at two sides of the offset spacer 20. This ion implantation preferably forms a lightly doped drain 24 at two sides of the gate structure 12. A chemical vapor deposition is conducted to form a cap layer 36 composed silicon nitride over the surface of the semiconductor substrate 10, the offset spacer 20, and the gate structure 12 thereafter.

Figure 2:
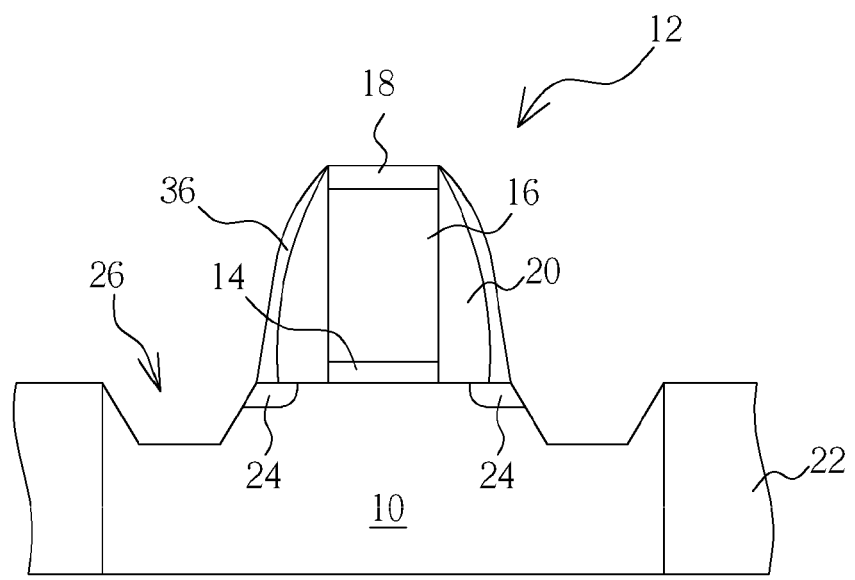

As shown in FIG. 2, an etching process is performed to form two recesses 26 in the semiconductor substrate 10 adjacent to two sides of the gate structure 12 while removing a portion of the cap layer 36 disposed on the semiconductor substrate 10 and the gate structure 12. In this embodiment, the cap layer 36 is preferably remained on the offset spacer 20 after the recesses 26 are formed. Alternatively, the cap layer 36 could also be removed while the recesses 26 are etched, which is also within the scope of the present invention.

Figure 3:
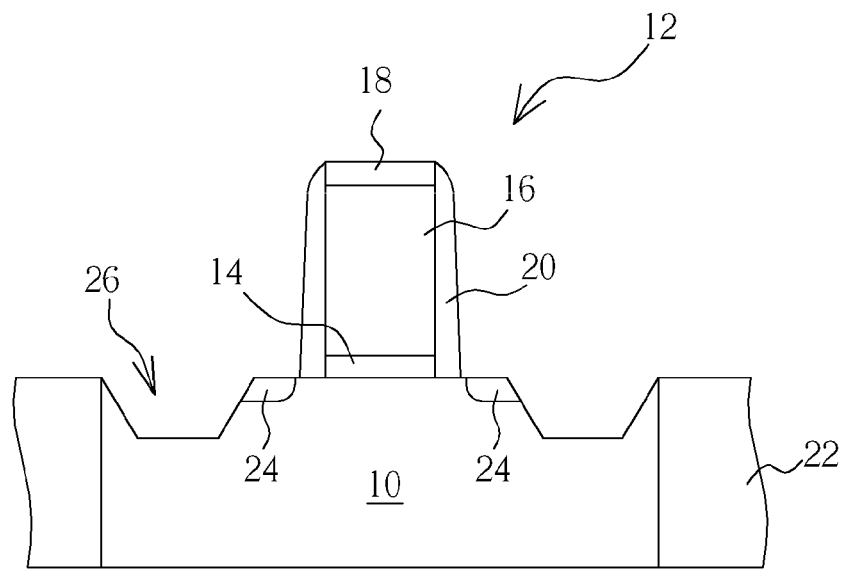

As shown in FIG. 3, a wet etching is conducted to remove the remaining cap layer 36 and a portion of the offset spacer 20. Preferably, phosphoric acid is used as the principal etchant for the wet etching process, and the wet etching process is conducted for approximately 15-30 seconds to remove the cap layer 36 and thin the offset spacer 20. This thinning process causes the offset spacer 20 to move inward with respect to the recesses 26 such that the thinned offset spacer 20 is not aligned to the sidewall of the recesses 26 and a gap is created between the lightly doped drain 24 and the thinned offset spacer 20.

Figure 4:
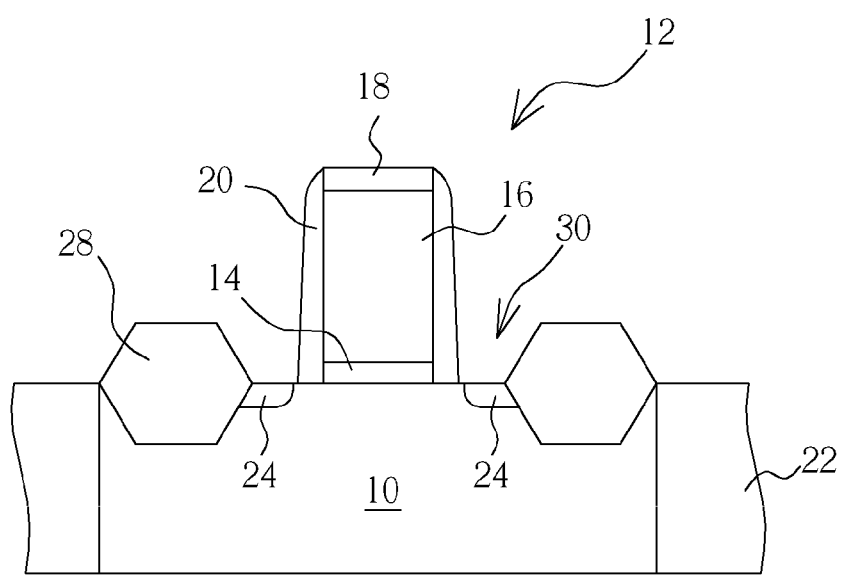

Next, a pre-cleaning process is conducted by using diluted hydrofluoric acid or SPM solution containing sulfuric acid, hydrogen peroxide, and deionized water to remove native oxides or other impurities from the surface of the recesses 26, and as shown in FIG. 4, a selective epitaxial growth process is performed to grow an epitaxial layer 28 composed of silicon germanium (SiGe) in the recesses 26.

It should be noted that by using a wet etching to thin a portion of the offset spacer 20 before pre-cleaning the recesses 26, the present invention could prevent the epitaxial layer 28 to grow against the sidewall of the offset spacer 20. Instead, a gap 30 of approximately 50 angstroms to 150 angstroms is formed between the epitaxial layer 28 and the sidewall of the offset spacer 20. According to a preferred embodiment of the present invention, the epitaxial layer 28 is grown with a substantial hexagonal shape in the two recesses 26 at two sides of the offset spacer 20. By forming the gap 30 between the epitaxial layer 28 and the offset spacer 20, Ion degradation resulted from epitaxial layer being too close to the offset spacer is improved significantly.

Figure 5:
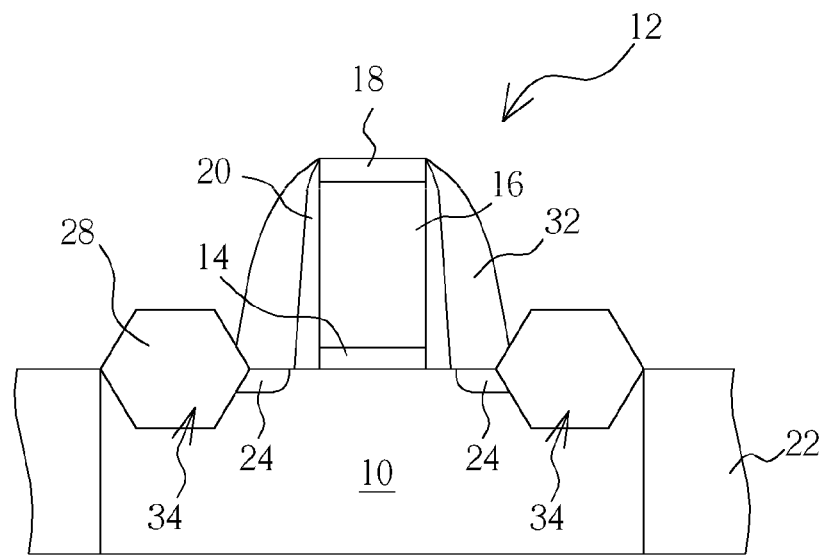

After the formation of the epitaxial layer 28, as shown in FIG. 5, a main spacer 32 composed of oxides and nitrides can be selectively formed around the offset spacer 20, and an ion implantation is selectively conducted thereafter by implanting p-type dopants into the semiconductor substrate 10 at two sides of the main spacer 32 to form a source/drain region 34. The source/drain region 34 could also be formed by in-situ doping during the selective epitaxial growth process. A salicide process is performed thereafter by sputtering a metal layer (not shown) composed of cobalt, titanium, platinum, palladium, or molybdenum on the epitaxial layer 28 and conducting at least one rapid thermal anneal process to react the metal layer and the epitaxial layer 28 for forming a silicide layer (not shown). This completes the fabrication of a PMOS transistor.

The aforementioned embodiment preferably uses a wet etching process to thin the offset spacer. Alternatively, the main spacer could be formed around the offset spacer right after the offset spacer is formed, the recesses could be formed by using the gate structure and the main spacer as a mask, and the wet etching process could be used to thin or remove the main spacer. In other words, after the gate structure is formed, the offset spacer and the main spacer are formed directly on the sidewall of the gate structure, and recesses used to grow an epitaxial layer are formed at two sides of the main spacer within the semiconductor substrate. Subsequently, phosphoric acid is used to thin a portion of the main spacer, and a pre-clean is conducted to remove impurities remained on the surface of the recesses. A selective epitaxial growth process is performed thereafter to form an epitaxial layer at two sides of the main spacer which have been thinned earlier.

Figure 6:
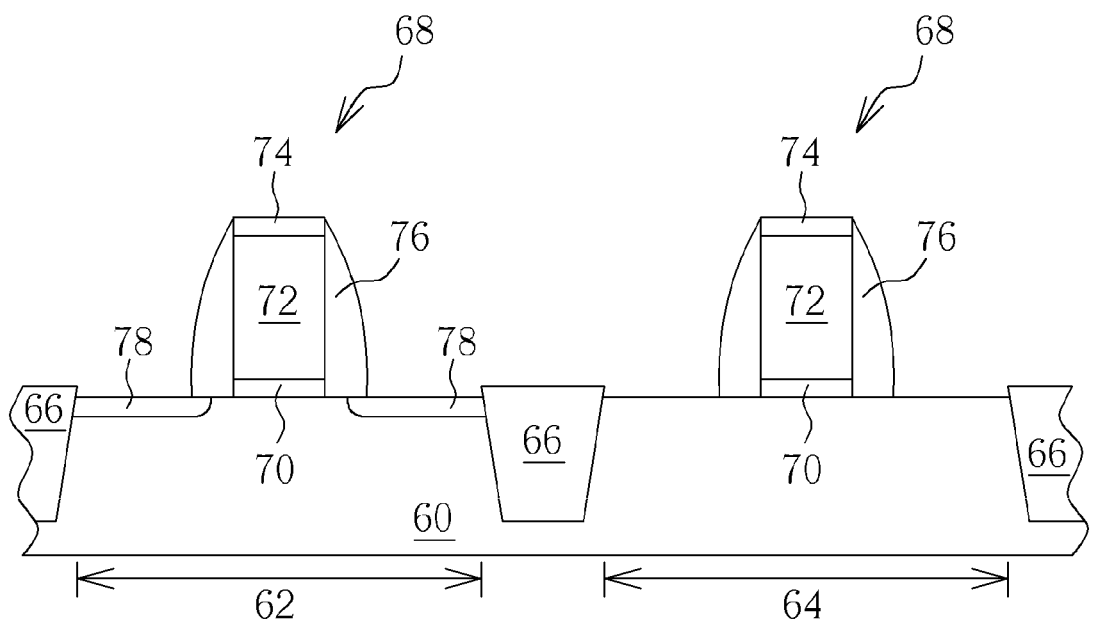
FIGS. 6-12 illustrate a method for fabricating a CMOS transistor according to a second embodiment of the present invention.

Referring to FIGS. 6-12, FIGS. 6-12 illustrate a method for fabricating a CMOS transistor according to a second embodiment of the present invention. In order to highlight the main feature of the present invention as well as simplify the entire flow, only one PMOS transistor region and one NMOS transistor region is shown in FIGS. 6-12. As shown in FIG. 6, a semiconductor substrate 60, such as a silicon substrate or a silicon-on-insulator substrate is provided. The semiconductor substrate 60 includes a plurality of PMOS transistor regions 62 and NMOS transistor regions 64, and a plurality of shallow trench isolations 66 used to isolate each of the PMOS and NMOS transistor regions. The shallow trench isolations 66 can be formed by etching the semiconductor substrate 60 and depositing silicon dioxide therein afterwards.

The semiconductor substrate 60 also includes a plurality of gate structures 68 disposed in the PMOS transistor region 60 and NMOS transistor region 64. Each of the gate structures 68 includes a gate dielectric layer 70, a gate 72 disposed on the gate dielectric layer 70, and a cap layer 74 disposed on top of the gate 74. The gate dielectric layer 70 is composed of silicon oxides or silicon nitrides, the gate 72 is composed of conductive material including polysilicon, silicides, or other metals, and the cap layer 74 is composed of dielectric material such as silicon nitride.

An offset spacer 76 composed of silicon nitride is then formed on the sidewall of each gate structure 68 disposed in the PMOS transistor region 62 and the NMOS transistor region 64, and a patterned mask (not shown) is formed to cover the NMOS transistor region 64. An ion implantation is conducted by using this patterned mask to implant p-type dopants into the semiconductor substrate 60 of the PMOS transistor region 62 with respect to two sides of the offset spacer 76 to form a lightly doped drain 78.

Figure 7:
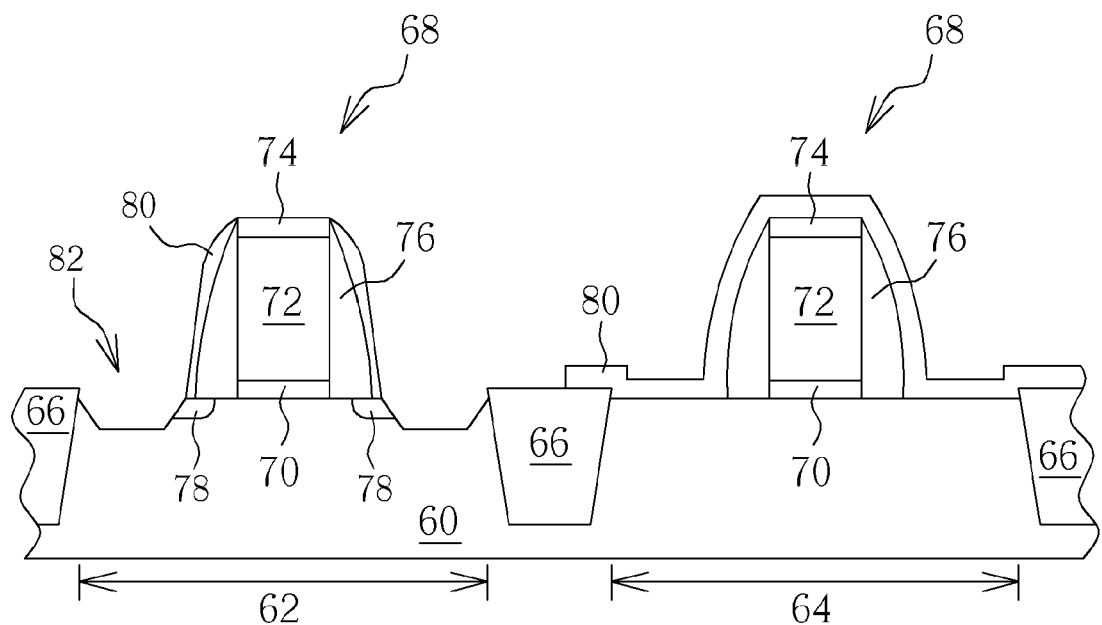

As shown in FIG. 7, the patterned mask is stripped from the NMOS transistor region 64, and a cap layer 80 composed of silicon nitride is deposited over the surface of the semiconductor substrate 60 and the gate structures 68 of the PMOS transistor region 62 and the NMOS transistor region 64. Next, the cap layer 80 disposed in the PMOS transistor region 62 is partially removed while a portion of the cap layer 80 is remained on the surface of the offset spacer 76, and an etching process (such as an anisotropic etching) is conducted by using the cap layer 80 remained in the NMOS transistor region 64 as a mask to form two recesses 82 in the semiconductor substrate 60 with respect to two sides of the offset spacer 76 of the PMOS transistor region 62. It should be noted the step of forming the aforementioned patterned mask (not shown) to form the lightly doped drain 78 could be eliminated. Instead, the cap layer 80 disposed in the NMOS transistor region 64 could be used directly as an etching mask to facilitate the formation of the lightly doped drain 78 and the recesses 82, which are all within the scope of the present invention.

Figure 8:
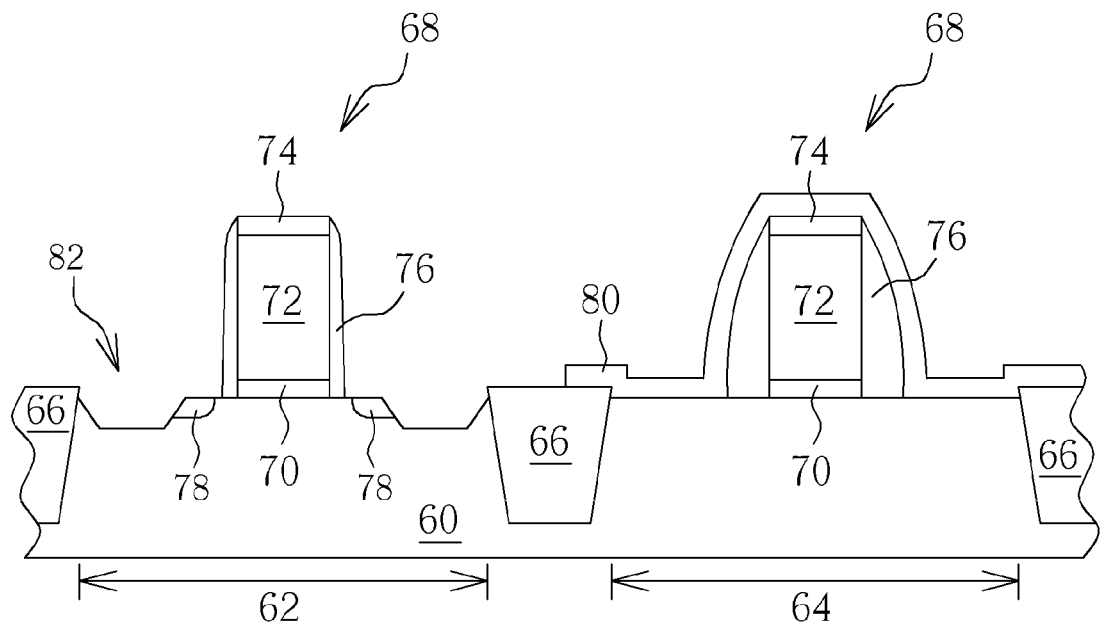

Next, as shown in FIG. 8, a wet etching process is performed to remove the cap layer 80 and a portion of the offset spacer 76 disposed in the PMOS transistor region 62. Similar to the first embodiment, phosphoric acid is primarily used as the etchant for this wet etching process, and the etching process is conducted for approximately 15-30 seconds to thin the offset spacer 76 such that the thinned offset spacer 76 is moved inward and not aligned to the sidewall of the recesses 82 and a gap is created between the lightly doped drain 78 and the thinned offset spacer 76.

Figure 9:
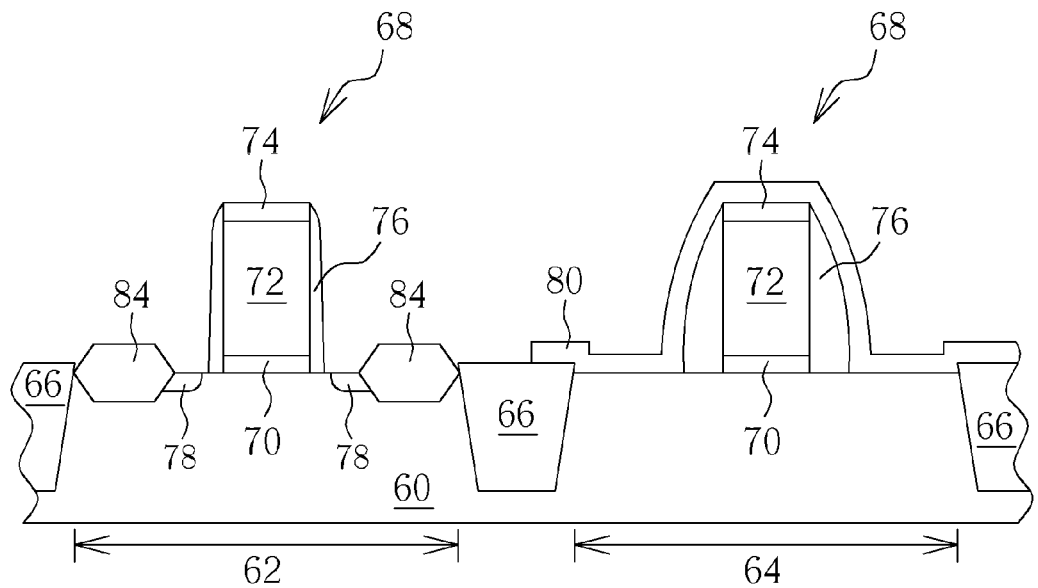

Next, a pre-cleaning process is conducted by using diluted hydrofluoric acid or SPM solution containing sulfuric acid, hydrogen peroxide, and deionized water to remove native oxides or other impurities from the surface of the recesses 82, and as shown in FIG. 9, a selective epitaxial growth process is performed to grow an epitaxial layer 84 composed of silicon germanium (SiGe) in the recesses 82.

Figure 10:
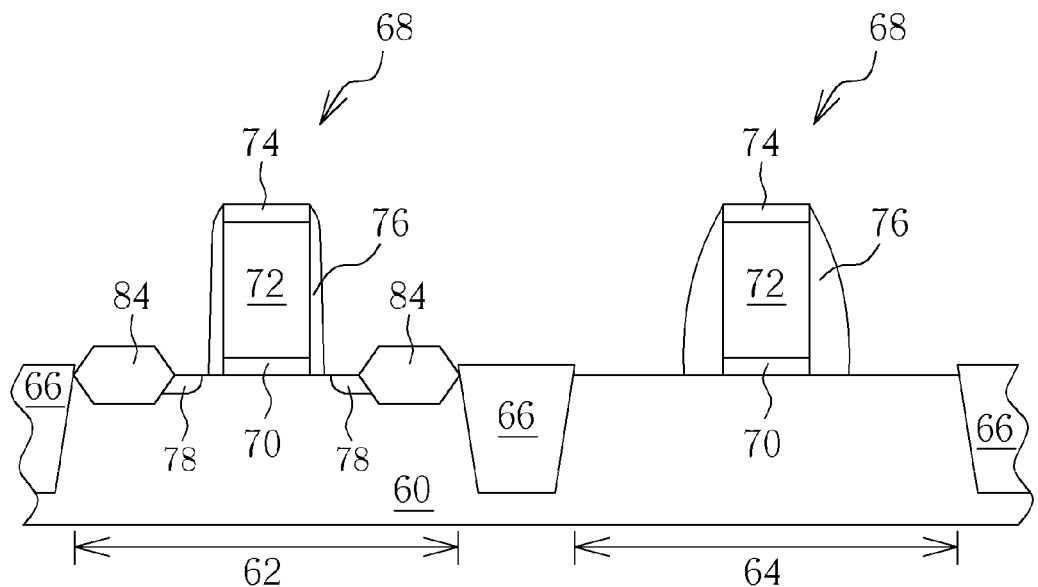

As shown in FIG. 10, another etching process is performed by using phosphoric acid as etchant to remove the cap layer 80 from the NMOS transistor region 64.

Figure 11:
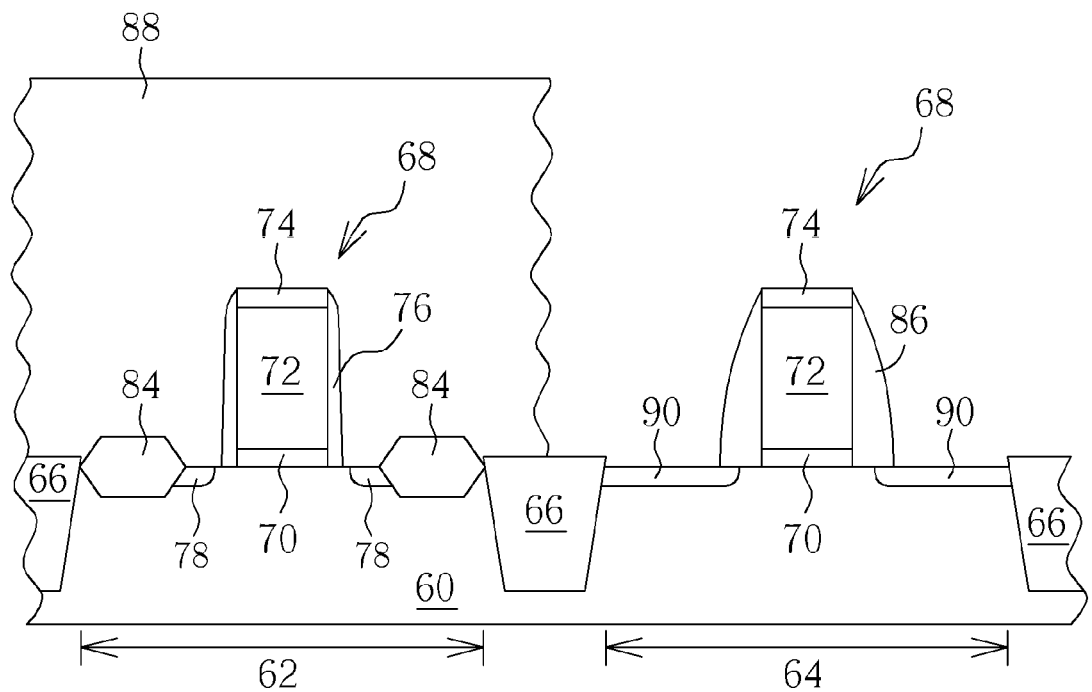

As shown in FIG. 11, a patterned mask 88 is formed to cover the PMOS transistor region 62, and an ion implantation is conducted by using the patterned mask 88 and the offset spacer 86 disposed in the NMOS transistor region 64 as mask to implant n-type dopants into the semiconductor substrate 60 at two sides of the offset spacer 86 for forming a lightly doped drain 90.

In addition to the aforementioned process, the offset spacers 76 of the PMOS transistor region 62 and the NMOS transistor region 64 could be removed simultaneously as the cap layer 80 is stripped, and another offset spacer 86 could be formed on the sidewall of each gate structure 68 of the PMOS transistor region 62 and the NMOS transistor region 64 thereafter. Next, a patterned mask 88, such as the one shown in FIG. 11 could be formed to cover the PMOS transistor region 62 and an ion implantation is performed to implant n-type dopants into the semiconductor substrate 60 at two sides of the offset spacer 86 of the NMOS transistor region 64, which is also within the scope of the present invention.

Figure 12:
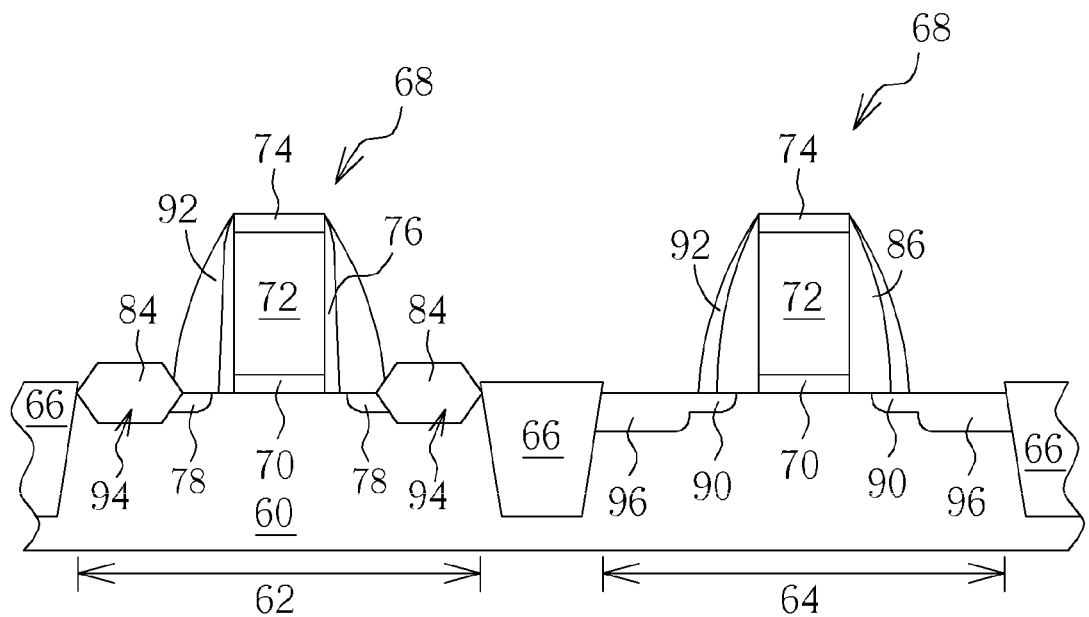

After stripping the patterned mask 88, as shown in FIG. 12, a main spacer 92 composed of oxides and nitrides is formed around the offset spacers 76, 86 of the PMOS transistor region 62 and the NMOS transistor region 64. Another patterned mask (not shown) is formed to cover the NMOS transistor region 64, and an ion implantation is conducted to implant p-type dopants into the semiconductor substrate 60 at two sides of the main spacer 92 of the PMOS transistor region 62 for forming a source/drain region 94. The patterned mask disposed in the NMOS transistor region 64 is then stripped, another patterned mask (not shown) is formed to cover the PMOS transistor region 62, and another ion implantation is conducted to implant n-type dopants into the semiconductor substrate 60 at two sides of the main spacer 92 of the NMOS transistor region 64 for forming a source/drain region 96.

Depending on the demand of the product, a salicide process can be performed by sputtering a metal layer (not shown) composed of cobalt, titanium, platinum, palladium, or molybdenum on the epitaxial layer 84 of the PMOS transistor region 62 and the source/drain region 96 of the NMOS transistor region 64, and conducting at least one rapid thermal anneal process to react the metal layer and the epitaxial layer 84 and the silicon substrate for forming a silicide layer (not shown). This completes the fabrication of a CMOS transistor.

Those skilled in the art will readily observe that numerous modifications and alterations of the device and method may be made while retaining the teachings of the invention.

What is claimed is:

1. A MOS transistor, comprising:
a semiconductor substrate having a gate thereon;
a spacer disposed on the sidewall of the gate;
two hexagonal epitaxial layers disposed in the semiconductor substrate with respect to two sides of the spacer; and
a lightly doped drain disposed between the spacer and the epitaxial layers and a gap is between the lightly doped drain and the spacer.

2. The MOS transistor of claim 1, wherein the spacer is an offset spacer.

3. The MOS transistor of claim 2, wherein the offset spacer comprises silicon nitride.

4. The MOS transistor of claim 1, wherein the epitaxial layer comprises a silicon germanium layer.

5. The MOS transistor of claim 1, wherein the MOS transistor is a PMOS transistor.

6. The MOS transistor of claim 1, further comprising the spacer is a main spacer.

7. The MOS transistor of claim 6, wherein the main spacer comprises oxides and nitrides.

8. The MOS transistor of claim 6, wherein the main spacer is partially disposed on the hexagonal epitaxial layer.

9. The MOS transistor of claim 6, wherein the main spacer is disposed on the lightly doped drain, the gap, and the epitaxial layers.

* * * * *